United States Patent
McGraw

(10) Patent No.: US 7,602,180 B2
(45) Date of Patent: Oct. 13, 2009

(54) SYSTEM AND METHOD FOR FAST TEXTURE-BASED TENSOR FIELD VISUALIZATION FOR DT-MRI

(75) Inventor: Tim McGraw, Morgantown, WV (US)

(73) Assignee: Siemens Aktiengesellschaft, München (DE)

(*) Notice: Subject to any disclaimer, the term of this patent is extended or adjusted under 35 U.S.C. 154(b) by 205 days.

(21) Appl. No.: 11/872,904

(22) Filed: Oct. 16, 2007

(65) Prior Publication Data

US 2008/0174311 A1 Jul. 24, 2008

Related U.S. Application Data

(60) Provisional application No. 60/856,119, filed on Nov. 2, 2006.

(51) Int. Cl.
*G01V 3/00* (2006.01)
(52) U.S. Cl. .................................... 324/307; 324/309
(58) Field of Classification Search ................ 324/307, 324/309
See application file for complete search history.

(56) References Cited

U.S. PATENT DOCUMENTS

| 6,441,821 | B1* | 8/2002 | Nagasawa | 345/426 |
| 6,642,716 | B1* | 11/2003 | Hoogenraad et al. | 324/309 |
| 6,992,484 | B2* | 1/2006 | Frank | 324/307 |
| 2006/0176488 | A1* | 8/2006 | McGraw | 356/446 |
| 2008/0109171 | A1* | 5/2008 | McGraw et al. | 702/19 |
| 2008/0170802 | A1* | 7/2008 | Arsigny et al. | 382/276 |
| 2008/0205733 | A1* | 8/2008 | Laidlaw et al. | 382/131 |
| 2008/0284434 | A1* | 11/2008 | Wedeen | 324/309 |

\* cited by examiner

*Primary Examiner*—Louis M Arana
(74) *Attorney, Agent, or Firm*—Donald B. Paschburg; F. Chau & Associates, LLC

(57) ABSTRACT

A method for visualizing diffusion-tensor magnetic resonance images, including the steps of providing a diffusion-tensor magnetic resonance image (DT-MRI) volume, positioning and orienting a virtual camera for rendering the volume, the camera having an image plane, the camera's orientation being defined by its look, right and up vectors, associating a billboard with each voxel, each the billboard being parallel with the image plane of the camera, where the look, right and up vectors are used to orient each the billboard, applying a texture to each billboard, each the texture being transformed by the inverse of the diffusion tensor associated with the voxel to which the billboard is associated, and rendering the volume by rendering each visible billboard in the image volume, where a 2-dimensional (2D) visualization of the DT-MRI is produced.

17 Claims, 5 Drawing Sheets

SYSTEM AND METHOD FOR FAST TEXTURE-BASED TENSOR FIELD VISUALIZATION FOR DT-MRI

CROSS REFERENCE TO RELATED UNITED STATES APPLICATIONS

This application claims priority from "FAST TEXTURE-BASED TENSOR FIELD VISUALIZATION FOR DT-MRI", U.S. Provisional Application No. 60/856,119 of Tim McGraw, filed Nov. 2, 2006, the contents of which are herein incorporated by reference.

TECHNICAL FIELD

This disclosure is directed to a rapid visualization of the tensor field computed from a diffusion tensor magnetic resonance dataset.

DISCUSSION OF THE RELATED ART

Diffusion tensor MRI (DT-MRI) provides useful connectivity information about neuronal tissue, but has several visualization challenges. The high dimensional nature of the data, which is a 3D volume image with a 3×3 matrix (the diffusion tensor) associated with each voxel, requires some processing to visualize on conventional 2D display devices.

Random molecular motion, known as Brownian motion, causes transport of water at a microscopic scale. Within an unrestricted volume of water, molecules freely diffuse in all directions. The water abundant in biological systems is also subject to such stochastic motion. The properties of the surrounding tissue can affect the magnitude of diffusion, as well as direction. Tissue can form a barrier to diffusion, restricting molecular motion. Within an oriented structure, such as a bundle of axonal fibers within the white matter of the brain or spinal cord, diffusion can be highly anisotropic.

The directional properties of diffusion can be characterized by a tensor. The diffusion tensor, D, is a symmetric, positive-definite 3×3 matrix. It is common to make use of the eigenvalues and eigenvectors of this tensor, sorting the eigenvalues ($\lambda_1$, $\lambda_2$, $\lambda_3$) from largest to smallest, and labeling the corresponding unit eigenvectors ($e_1$, $e_2$, $e_3$). The eigenvalues represent the magnitude of diffusion in the direction of their corresponding eigenvector. The eigenvector corresponding to the largest eigenvalue is called the principal diffusion direction (PDD). When diffusion is isotropic we have $\lambda_1=\lambda_2=\lambda_3$. A popular visual representation of anisotropic diffusion is the diffusion ellipsoid. This ellipsoid is the image of the unit sphere under the transformation defined by the tensor, D. The eigenvectors of D form an orthogonal basis, representing the orientation of the ellipsoid. The length of each axis of the ellipsoid is the corresponding eigenvalue. For isotropic diffusion, the diffusion ellipsoid is a sphere.

Recently, magnetic resonance (MR) measurements have been developed to measure the diffusion tensor. This provides a complete characterization of the restricted motion of water through the tissue that can be used to infer tissue structure. Researchers have since developed general methods of acquiring and processing the diffusion tensor of MR measured translational self-diffusion.

Tensor field visualization has been an active area of recent research. There are not only medical imaging applications, but also engineering applications, since mechanical stress and strain are also represented as tensors. The challenge of DT-MRI visualization is to simultaneously convey as much relevant information as possible: mean diffusivity, principal diffusion direction (PDD), anisotropy, and oblateness/prolateness of the diffusion ellipsoid. Many of these quantities can be computed from the elements of the tensor, D, at each voxel or from the eigenvalue decomposition of D: the PDD is the dominant eigenvector of D, fractional anisotropy (FA) is the normalized variance of the eigenvalues, mean diffusivity is the trace of D.

The most common tensor field visualization techniques will be categorized and described here. Glyph-based visualization relies on a small graphical icon at each voxel to represent each tensor. Ellipsoids can be computed by applying the diffusion tensor to each vertex of a triangulated sphere. The major axis of the ellipsoid is a good visual indicator of the principal diffusion direction. The shape of the ellipsoid is an indicator of anisotropy. However, the appearance of these glyphs can be uninformative at some viewing angles. Superquadric glyphs have been used to overcome this visual ambiguity. Another type of glyph which was capable of conveying more diffusion information are streamlines and streamtubes. In order to emphasize the PDD, and the supposed direction of underlying neuronal fibers, streamlines and streamtubes can visualize diffusion information. Streamlines are curves which are tangent to the vector field at each point on the curve (also called integral curves). Streamtubes are cylindrical surfaces whose axis is a streamline. Although these are vector field visualization techniques, they can be adapted to reflect additional information about the tensor field. Streamtubes and streamsurfaces have been displayed with radius proportional to FA in order to convey information about the underlying tensor field. Particles are another discrete technique for representing a tensor field. In this case, the icon or glyph representing the tensor is not stationary, but advects through the PDD field, changing its appearance to reflect the tensor at its current position. Some researchers have used the GPU to accelerate the rendering and animation of particles for tensor field visualization.

Glyph based techniques suffer from some challenges. For large datasets the display can become too dense. In 3D datasets the discrete glyphs and streamtubes often obscure each other. To deal this effect, traditional volume visualization techniques, such as raycasting and splatting, can be applied to a field of scalar indices of the tensors, such as fractional anisotropy (FA) or trace.

Texture-based visualization techniques produce an image in which texture orientation and frequency reflect the tensor data. Line integral convolution (LIC) is a process of blurring or convolving a noise image with a curvilinear kernel aligned with the local streamline through each voxel. The resulting image has highly correlated intensity values along each streamline, and uncorrelated intensity across streamlines. This technique can be applied to DT-MRI by combining the LIC texture, the color computed from the PDD field, and the FA image to produce an image reflecting diffusion direction and anisotropy. Textures can also be produced by simulating a reaction-diffusion process that may evolve anisotropically. This concept can be used to visualize tensor fields. This visualization requires the solution of a partial differential equation. A hybrid approach to rendering textured glyphs can portray all 6 tensor components. The glyphs can be overlaid on a scalar image (an FA image, for example) resulting in a layered image.

SUMMARY OF THE INVENTION

Exemplary embodiments of the invention as described herein generally include methods and systems for visualizing tensor-valued data. A method according to an embodiment of the invention requires minimal preprocessing and can be implemented and executed much faster than other existing texture-based approaches. This is accomplished by using a hybrid approach, which has similarities to existing glyph, particle and texture-based visualization techniques. The resulting image is formed by blending textured billboards which are rendered at the center of each voxel in the dataset. Color, texture orientation, texture frequency and animation are used to convey diffusion properties. Results are presented for a DT-MRI image of a human brain.

According to an aspect of the invention, there is provided a method for visualizing diffusion-tensor magnetic resonance images, including the steps of providing a diffusion-tensor magnetic resonance image (DT-MRI) volume, the image volume comprising a plurality of 3×3 diffusion tensors associated with a 3-dimensional grid of voxels, positioning and orienting a virtual camera for rendering the volume, the camera having an image plane, the camera's orientation being defined by its look, right and up vectors, associating a billboard with each voxel, each the billboard being parallel with the image plane of the camera, where the look, right and up vectors are used to orient each the billboard, applying a texture to each billboard, each the texture being transformed by the inverse of the diffusion tensor associated with the voxel to which the billboard is associated, and rendering the volume by rendering each visible billboard in the image volume, where a 2-dimensional (2D) visualization of the DT-MRI is produced.

According to a further aspect of the invention, the texture comprises an isotropic image.

According to a further aspect of the invention, the method includes transforming the texture into a pattern representative of the diffusion tensor.

According to a further aspect of the invention, the method includes mapping a principle diffusion direction of the diffusion tensor associated with a voxel to a color, where the billboard associated with the voxel is rendered with the color.

According to a further aspect of the invention, a transparency of each billboard is determined by the fractional anisotropy of the diffusion tensor associated with each the billboard.

According to a further aspect of the invention, the method includes rendering a sequence of 2D visualizations, where for each 2D visualization an additive offset is applied to each texture mapping along a principle diffusion direction of each the associated diffusion tensor, where an animation is produced.

According to a further aspect of the invention, the visualization is performed by programmable vertex shaders of a graphics processing unit.

According to another aspect of the invention, there is provided a program storage device readable by a computer, tangibly embodying a program of instructions executable by the computer to perform the method steps for visualizing diffusion-tensor magnetic resonance images.

DETAILED DESCRIPTION OF EXEMPLARY EMBODIMENTS

Figure 1:
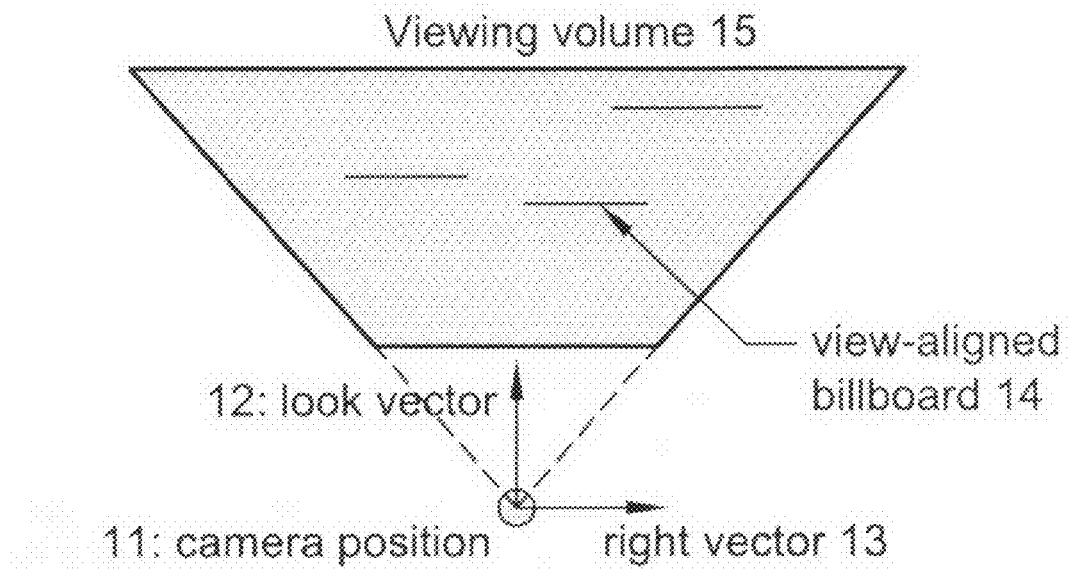
FIG. 1 illustrates the relationship between a view volume, a camera frame and view-aligned billboards, according to an embodiment of the invention.

Exemplary embodiments of the invention as described herein generally include systems and methods for rapid visualization of the tensor field computed from a diffusion tensor magnetic resonance image. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

As used herein, the term "image" refers to multi-dimensional data, such as matrices or tensors, associated with discrete image elements arranged as 2-dimensional or 3-dimensional grids. For a 2- or 3-dimensional image, the domain of the image is typically a 2- or 3-dimensional rectangular array, wherein data associated with each element can be addressed with reference to a set of 2 or 3 mutually orthogonal axes. The image may be, for example, a medical image of a subject collected by any imaging modality known to one of skill in the art to be capable of producing tensor-valued data, such as magnetic resonance imaging. The image may also be provided from non-medical contexts, such as, for example, remote sensing systems, electron microscopy, etc. The terms "digital" and "digitized" as used herein will refer to images or volumes, as appropriate, in a digital or digitized format acquired via a digital acquisition system or via conversion from an analog image.

A visualization technique according to an embodiment of the invention uses a discrete field of geometric objects, as in glyphs, where these glyphs are oriented toward the viewer, and oriented patterns are used to represent the data, as in texture-based techniques. A method according to an embodiment of the invention can visualize the diffusion tensor field using an array of view-aligned texture-mapped polygons. The position of these polygons will correspond to points in the image lattice. The orientation of the polygons will depend on the camera orientation, as described below. The texture applied to each polygon will be controlled by the tensor at the corresponding voxel in the dataset.

Billboarding is a computer graphics technique for rendering polygons which always appear to face the viewer. The technique is as follows. In computer graphics, the position and orientation of the viewer can be described by the camera frame. This frame includes the camera position and 3 orthogonal basis vectors: look, right and up. The relationship between a view volume, a camera frame and view-aligned billboards is illustrated in FIG. 1. Referring to FIG. 1, the look vector 12 is the direction the virtual camera 11 is pointed, and the right 13 and up vectors lie in the image plane. Note that the up vector comes out of the figure page, thus is not shown. The viewing volume 15 is that portion of the image volume being rendered by the virtual camera, and billboards 14 are shown in the volume that are aligned with the viewing direction of the camera. These vectors can be directly extracted from the view matrix, which is the matrix describing the transformation from the world coordinate system to the camera coordinate system. Once the camera is positioned in the scene one can extract the right and up vectors, then construct polygons at arbitrary positions such that they are parallel with the image plane. Note that the terms "polygon" and "billboard" are synonymous.

A billboard is a flat object, usually a quad (square), which faces the camera. This direction can change as an object and camera move, in which case the billboard needs to be rotated each frame to point in that direction. There are two types of billboards: point and axis. A point billboard is a quad that is centered at a point such that the billboard rotates about that central point to face the camera. An axis billboard comes in two types: axis aligned and arbitrary. An axis-aligned billboard has one local axis that is aligned with a global axis, and can be rotated about that axis to face the camera. An arbitrary axis billboard can be rotated about any axis to face the camera. The coordinate system for a billboard assumes the billboard will face the +z axis, where up is the +y axis, and right is the +x axis. In the following description, it is assumed that all vectors are normalized to unit magnitude.

Point billboards come in two varieties: collective or individual. Collective billboards share one transformation matrix between all the billboards, while individual billboards have a separate transformation matrix for each billboard.

Collective billboards all face the same direction, which is calculated as the inverse look direction of the camera. The up vector for the collective point billboard is the same as the up vector for the camera, and the right vector is the inverse of the camera's right vector.

Calculating the direction for an individual billboard requires knowledge of the camera's up vector and position and the billboard's position. The billboard look vector is calculated from the camera position and billboard position, and points from the billboard to the camera: $look_{bb}=pos_{cam}-pos_{bb}$.

The right vector for the billboard can be calculated in two steps. First, the billboard right vector can be calculated from the cross product of the billboard look vector and the camera up vector: $right_{bb}=up_{cam} \times look_{bb}$. Then, the up vector for the billboard can be calculated from the cross product of the billboard right vector and the billboard look vector: $up_{bb}=look_{bb} \times right_{bb}$. This calculation works because the final billboard up vector, the billboard look vector, and the camera up vector lie along the plane that contains the camera and billboard locations. The plane also has a normal equal to the billboard right vector.

Axis aligned billboards lock their up vector into a global axis, either x, y or z. The billboard is then rotated around the local y axis to face the camera. The calculations follow the same format as above, but having the local up vector makes for simpler math. There are three cases of axis aligned billboards, one for each axis. As stated above, the billboard up vector cameos from the camera up vector, and the billboard is always rotated about the local y axis. The billboard look vector can be calculated as the vector from the billboard center to the camera location. The component for the axis to which the billboard is aligned is then set to zero. The up vector is provided as the aligned axis, so there is no need to use a temporary up vector to create the right vector. Instead, the billboard right vector can be calculated as the cross product of billboard up and look vectors: $right_{bb}=up \times look_{bb}$.

For an arbitrarily aligned billboard, the billboard look vector can be initially calculated as the vector from the billboard center to the camera position. This value is not the final look vector, but rather a temporary value used to calculate the right and up vectors. This works on the same principal as the point billboard using the camera up vector as a temporary billboard up vector. This look vector lies along the same plane as the final look vector, but the temporary look vector is not perpendicular to the billboard up vector. The billboard up vector is the arbitrary axis about which the billboard will rotate. The right vector can now be calculated as a cross product of the up and look vectors: $right_{bb}=up \times look_{bb}$. Now that there are legitimate up and right vectors, the final look vector can be calculated: $look_{bb}=right_{bb} \times up$.

One rare special case occurs when the billboard up vector is almost parallel to the billboard look vector, in which case the cross product does not yield a normalized vector, due to floating point limitations. If the vectors are parallel, the cross product will have a magnitude of zero. Thus, if the look and up vectors are parallel, one can choose to not draw the billboard since the view is down the edge of a flat polygon.

Since the billboard vectors are normalized, an orthogonal rotation matrix can be constructed for a billboard. The following matrix can be used to transform the local coordinate system into the global coordinate system:

$$\begin{bmatrix} r_1 & u_1 & l_1 & p_x \\ r_2 & u_2 & l_2 & p_y \\ r_3 & u_3 & l_3 & p_z \\ 0 & 0 & 0 & 1 \end{bmatrix}$$

By multiplying by this matrix in the rendering stage, the billboard will face the camera.

In order to render a billboard, set the y axis to the billboard up vector, and the x axis to the right vector, so that the billboard is drawn along the xy plane facing down the +z axis. Coordinate values for the billboard can be changed as needed, as long as all the points are on the same plane. If the billboard points are not in the xy plane, the billboard matrix will need to be adjusted so that the billboard look vector is the normal to the plane that the billboard is on. For example, if the billboard is in the xz plane, the normal for that plane is the +y axis. The billboard look vector now needs to be rotated into the +y axis. The billboard up vector can be rotated into the +z axis, and the right vector is the cross product of the look and up vectors, which is the +x axis.

Each billboard will have an identical texture image applied to it, but the mapping function between the image coordinates and the polygon vertex coordinates will be transformed by $D^{-1}$, the inverse of the diffusion tensor. The mapping function depends on texture coordinates, which are explicitly associated with each vertex, and the 3×3 texture matrix. When a triangle is rasterized, an interpolated texture coordinate is computed for each fragment. This texture coordinate is then transformed by the texture matrix, using matrix-vector multiplication. The result is taken as an image coordinate, and the fragment is colored with the image color at that image coordinate.

In the most popular computer graphics APIs, such as OpenGL and Direct3D, it is possible for a programmer to control how textures are applied to the geometric primitives during rendering by specifying a matrix which will transform texture coordinates before the image is applied. In OpenGL, this 4×4 homogeneous texture matrix is part of the OpenGL state. In modern GPUs, the multiplication of texture coordinates by the texture matrix can be performed in hardware very efficiently.

The texture image used is an isotropic image, such as a cube or a Gaussian blob. The purpose of the texture matrix is to stretch this image into a pattern which represents the diffusion tensor. This matrix can also apply a scaling transformation to the texture, so different effects can be obtained by setting different boundary conditions on the texture. The wrapping mode (GL_REPEAT in OpenGL) creates a periodic texture which may result in several ellipsoidal features corresponding to each voxel. The repetition frequency in the pattern represents mean diffusivity at that voxel, so it does convey useful information.

Figure 2:
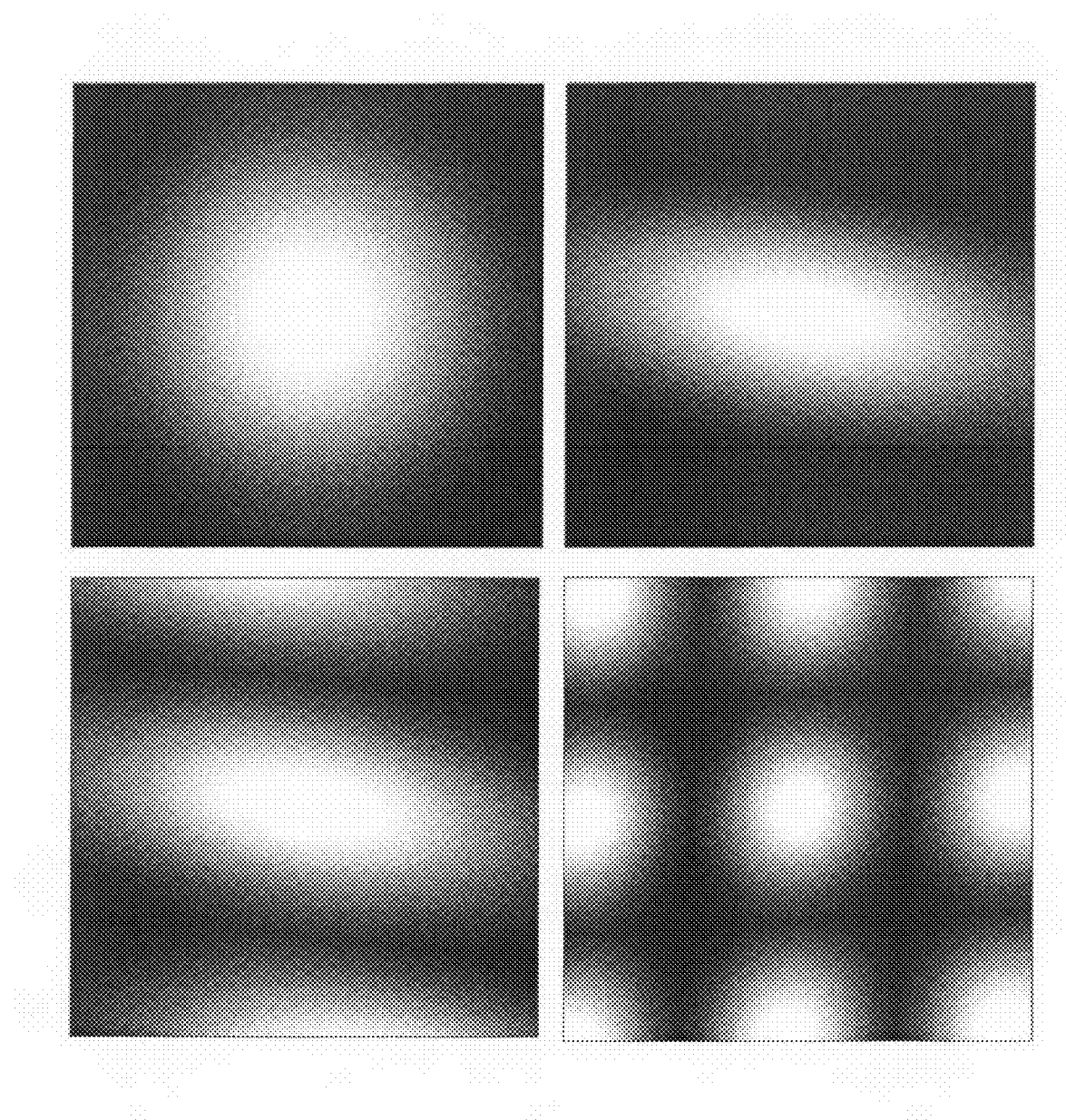
FIG. 2 depicts exemplary textured billboards for 4 different tensors, according to an embodiment of the invention.

FIG. 2 depicts exemplary textured billboards for 4 different tensors, according to an embodiment of the invention. Isotropic diffusion is shown at the top-left, anisotropic diffusion with texture clamping at the top-right, anisotropic diffusion with texture wrapping at the bottom-left, and low mean diffusivity with texture wrapping is shown at the bottom-right.

To display the diffusion tensor field, one billboard is rendered for each visible voxel. For each billboard, the texture matrix is set to be equal to $D^{-1}$ at that voxel. As described, this visualization technique does not require the computation of streamlines, or even eigenvalues of the diffusion tensor. However, if available, this information can be incorporated into the visualization. As is common in streamline visualizations, the principal diffusion direction may be mapped to the (r, g, b) color and each billboard rendered with this color. FA may be used to modulate transparency of the billboard. The PDD can also be used to produce animation. While rendering a sequence of 2D visualizations, by applying an additive offset to the texture mapping for each frame along the PDD, one can produce the impression of the texture "flowing" over the billboard in the PDD direction. Other texture-based techniques can incorporate animation by modifying certain parameters. In LIC, the kernel width and shape can be modified. In the reaction-diffusion PDE approach, the reaction function can be changed. However, in both cases, a numerically expensive recomputation is required.

Figure 6:
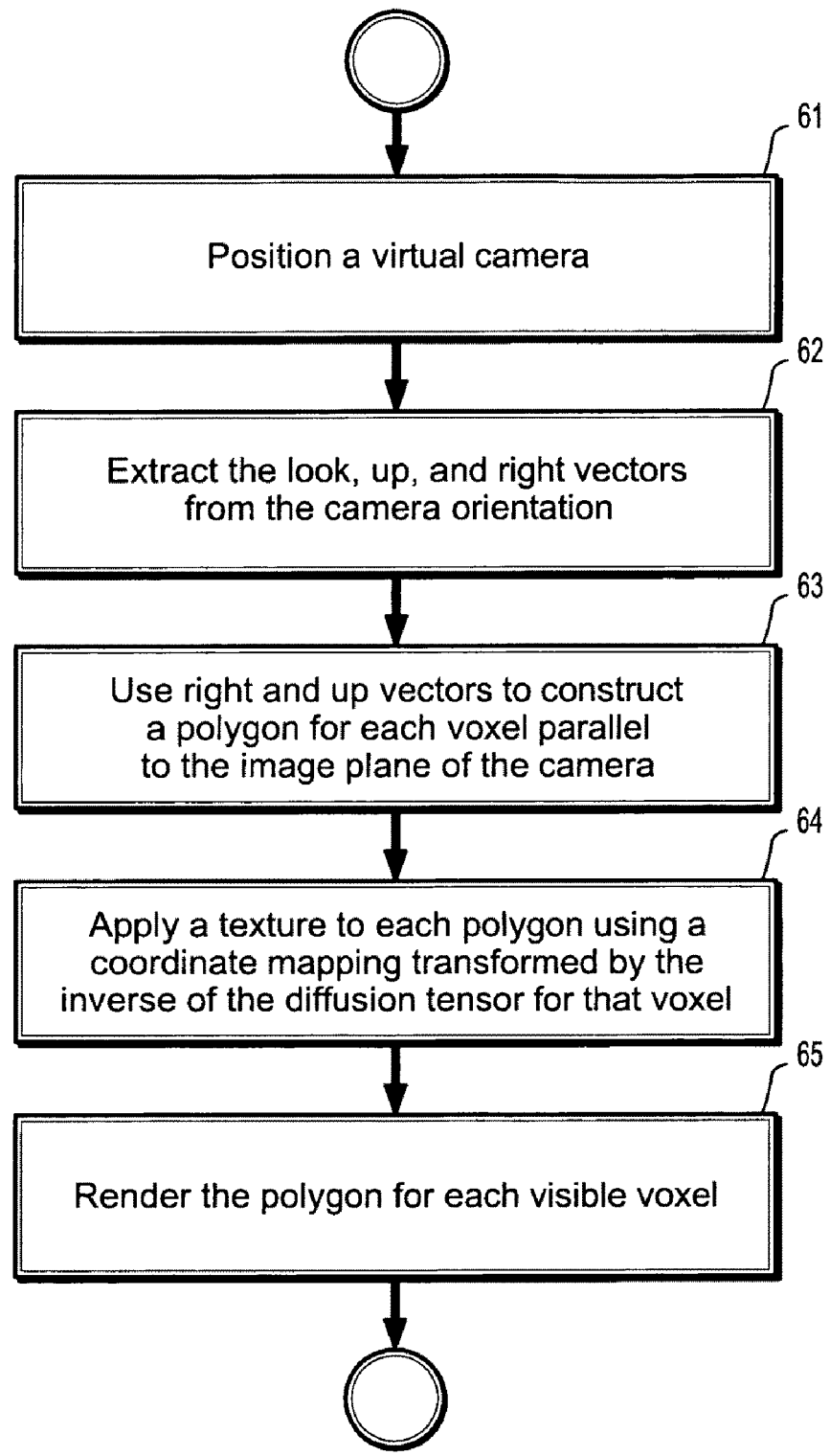
FIG. 6 is a flowchart of a method for a DT-MRI based tensor field visualization, according to an embodiment of the invention.

A flowchart of a method for a DT-MRI based tensor field visualization is depicted in FIG. 6. Referring to the figure, a method begins at step 61 by determining a position and viewing direction of a virtual camera with respect to the image volume to be visualized. During the rendering step, rays will be projected from the virtual camera to a virtual image plane. At step 62, the look, up, and right vectors are extracted from the camera orientation. The right and up vectors are used at step 63 to construct, for each voxel in the image volume, a polygon parallel to the image plane of the camera. At step 64, for each image voxel, a texture transformed by the $D^{-1}$ for that voxel is applied to the polygon associated with the voxel. Rendering is performed at step 65, where one polygon is rendered for each visible voxel.

It is possible to implement an algorithm according to an embodiment of the invention using the programmable vertex shaders of modern GPUs, but the implementation is amenable to older hardware. Even without programmable vertex shaders, this technique can be used at realtime frame rates. This visualization technique does not require time-consuming streamline integration, as in LIC, nor the numerical solution of a partial differential equation, as in reaction-diffusion textures. The static version of this technique can be applied without even computing eigenvalues. The resolution of the displayed image depends on the texture image applied to each glyph, so that one can compute high resolution visualizations for low resolution datasets.

Figure 3:
FIG. 3 depicts a billboard based visualization applied to a human brain DT-MRI dataset, showing part of a single coronal slice is shown, according to an embodiment of the invention.
Figure 4:
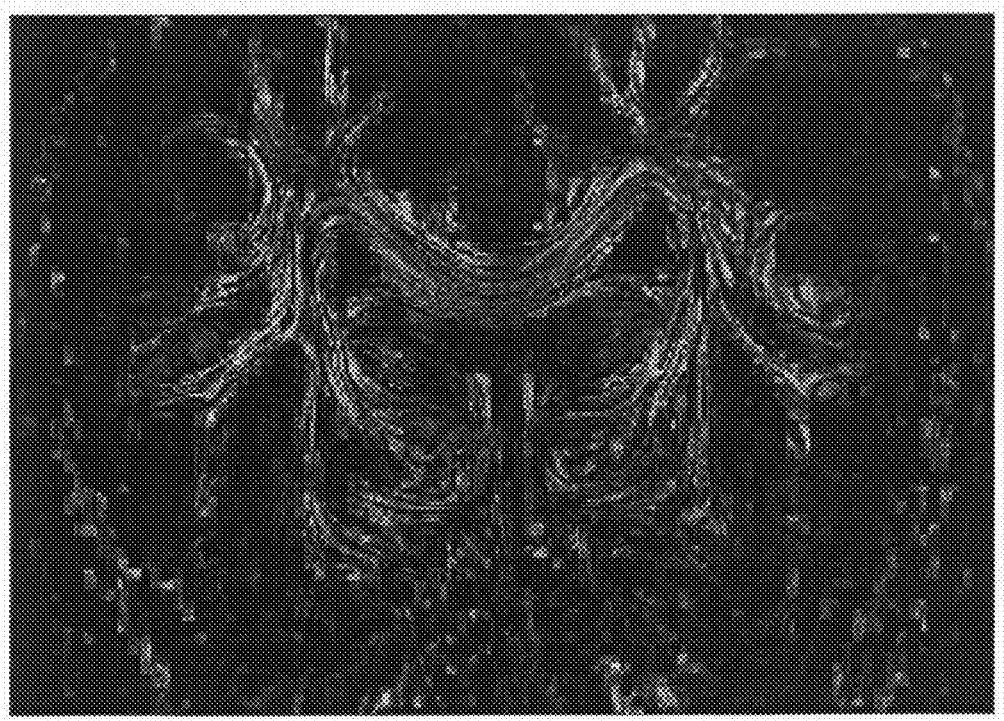
FIG. 4 shows a line integral convolution image for the same region as FIG. 3, according to an embodiment of the invention.

A visualization technique according to an embodiment of the invention was applied to a DT-MRI image of a human brain. The results are shown in FIG. 3. Specifically, FIG. 3 depicts a billboard based visualization applied to a human brain DT-MRI dataset, showing part of a single coronal slice is shown, according to an embodiment of the invention. For comparison an LIC image of the same axial slice was computed and shown in the FIG. 4.

Figure 5:
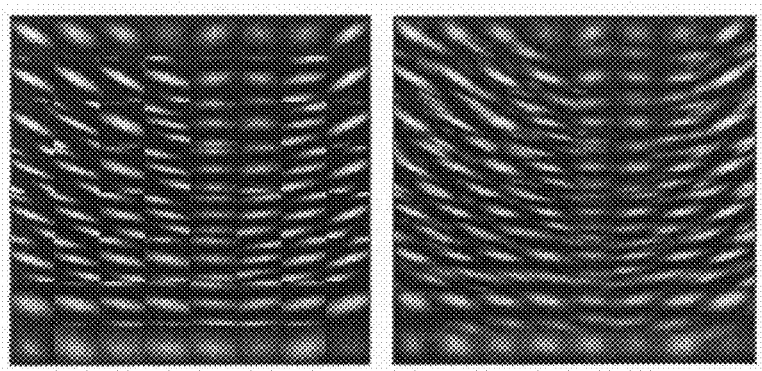
FIG. 5 illustrates billboard details showing non-overlapping billboards on the left, and overlapping and blended billboards on the right, according to an embodiment of the invention.

Both techniques convey diffusion anisotropy as color intensity, and principal diffusion direction as hue and texture orientation. The billboard technique according to an embodiment of the invention also conveys mean diffusivity information in the texture frequency of each billboard. The billboard technique required less than one second to compute while the LIC image required over one minute, using a Dell Optiplex GX620 computer running a Pentium 4 3.2 GHz CPU and having 2 GB of RAM. FIG. 3 was generated by rendering one textured billboard per voxel. The billboard color is computed from the PDD, and acts as an additional directional cue. The billboard intensity is equal to the FA value at each voxel. In this figure, the billboard was made slightly larger than the size of the voxel. Overlapping the billboards and blending can reduce some artifacts visible at the edges, as detailed in FIG. 5. In particular, FIG. 5 illustrates billboard details showing non-overlapping billboards on the left, and overlapping and blended billboards on the right, according to an embodiment of the invention.

A visualization technique according to an embodiment of the invention as described herein can produce images which are capable of conveying much information about a diffusion tensor field. Diffusion orientation and anisotropy can be represented using color and texture features. These images can be computed with very little processing time, and the implementation of the algorithm is simple and direct compared to other texture-based methods. The quality of results of other texture-based techniques depends on many factors, such as input noise texture, filter width and reaction function. The trial-and-error associated with optimizing these inputs can be quite time consuming. By contrast, a technique according to an embodiment of the invention has very few parameters. The speed of the billboarding makes parameter tuning much faster since the image can be recomputed in real-time.

The static results lack the long-range visual coherence of streamtube techniques, but this effect is reduced when texture animation is utilized. These results show some visual artifacts between voxels due to the piecewise constant nature of the visualization, however this can be reduced by interpolation between the voxels.

It is to be understood that embodiments of the present invention can be implemented in various forms of hardware, software, firmware, special purpose processes, or a combination thereof. In one embodiment, the present invention can be implemented in software as an application program tangible embodied on a computer readable program storage device. The application program can be uploaded to, and executed by, a machine comprising any suitable architecture.

Figure 7:
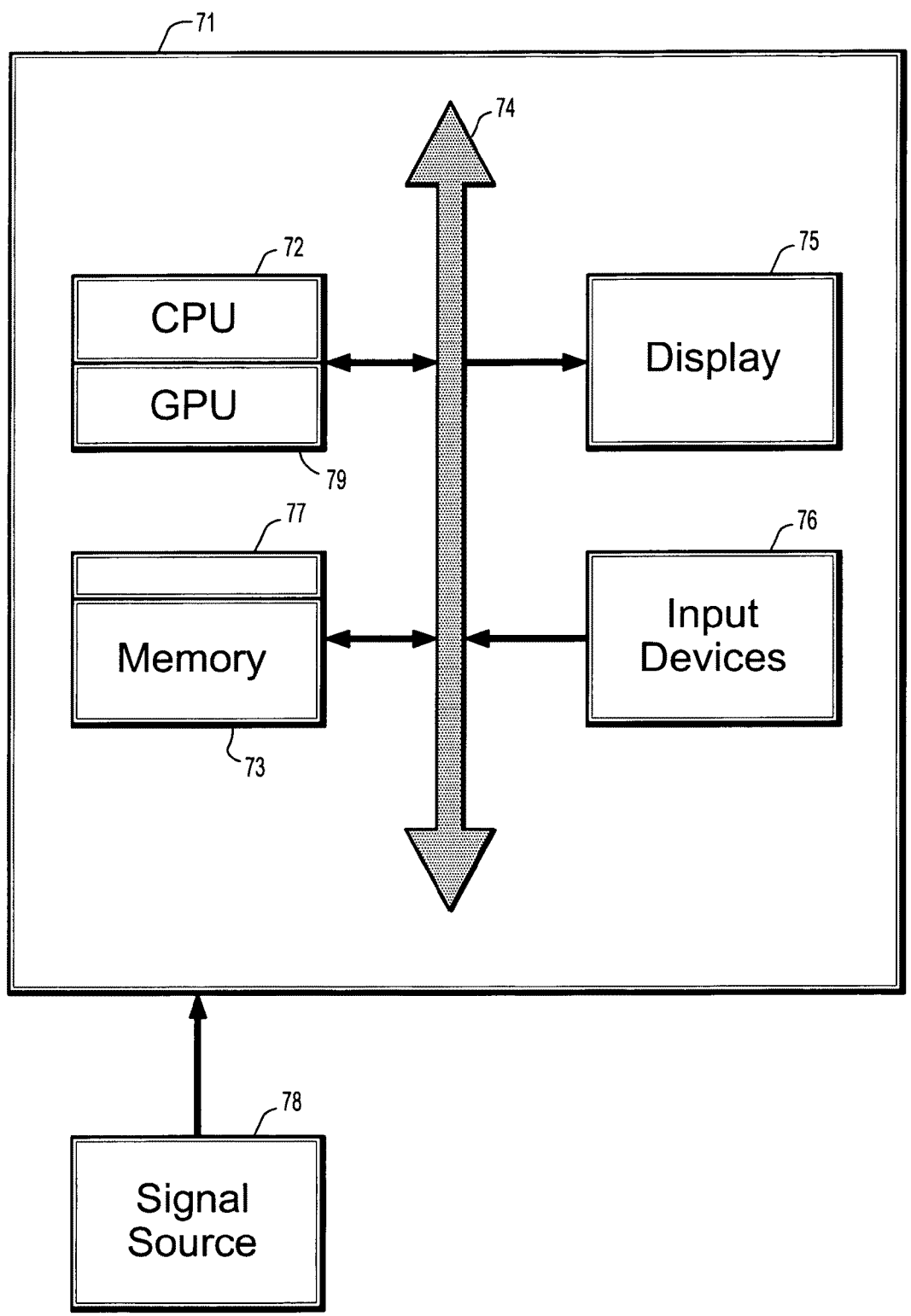
FIG. 7 is a block diagram of an exemplary computer system for implementing a method for rapid visualization of the tensor field computed from a diffusion tensor magnetic resonance image, according to an embodiment of the invention.

FIG. 7 is a block diagram of an exemplary computer system for implementing a method for rapid visualization of the tensor field computed from a diffusion tensor magnetic resonance dataset, according to an embodiment of the invention. Referring now to FIG. 7, a computer system 71 for implementing the present invention can comprise, inter alia, a central processing unit (CPU) 72, a graphics processing unit (GPU) 79, a memory 73 and an input/output (I/O) interface 74. The computer system 71 is generally coupled through the I/O interface 74 to a display 75 and various input devices 76 such as a mouse and a keyboard. The support circuits can include circuits such as cache, power supplies, clock circuits, and a communication bus. The memory 73 can include random access memory (RAM), read only memory (ROM), disk drive, tape drive, etc., or a combinations thereof. The present invention can be implemented as a routine 77 that is stored in memory 73 and executed by the CPU 72 and/or the GPU 79 to process the signal from the signal source 78. As such, the computer system 71 is a general purpose computer system that becomes a specific purpose computer system when executing the routine 77 of the present invention.

The computer system 71 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

While the present invention has been described in detail with reference to a preferred embodiment, those skilled in the art will appreciate that various modifications and substitutions can be made thereto without departing from the spirit and scope of the invention as set forth in the appended claims.

What is claimed is:

1. A method for visualizing diffusion-tensor magnetic resonance images comprising the steps of:
    providing a diffusion-tensor magnetic resonance image (DT-MRI) volume, said image volume comprising a plurality of 3×3 diffusion tensors associated with a 3-dimensional grid of voxels;
    positioning and orienting a virtual camera for rendering said volume, said camera having an image plane, said camera's orientation being defined by its look, right and up vectors;
    associating a billboard with each voxel, each said billboard being parallel with the image plane of the camera, wherein said look, right and up vectors are used to orient each said billboard;
    applying a texture to each billboard, each said texture being transformed by the inverse of the diffusion tensor associated with the voxel to which the billboard is associated; and
    rendering said volume by rendering each visible billboard in said image volume, wherein a 2-dimensional (2D) visualization of said DT-MRI is produced.

2. The method of claim 1, wherein said texture comprises an isotropic image.

3. The method of claim 2, further comprising transforming said texture into a pattern representative of said diffusion tensor.

4. The method of claim 1, further comprising mapping a principle diffusion direction of the diffusion tensor associated with a voxel to a color, wherein said billboard associated with said voxel is rendered with said color.

5. The method of claim 1, wherein a transparency of each billboard is determined by the fractional anisotropy of the diffusion tensor associated with each said billboard.

6. The method of claim 1, further comprising rendering a sequence of 2D visualizations, wherein for each 2D visualization an additive offset is applied to each texture mapping along a principle diffusion direction of each said associated diffusion tensor, wherein an animation is produced.

7. The method of claim 1, wherein said visualization is performed by programmable vertex shaders of a graphics processing unit.

8. A method for visualizing diffusion-tensor magnetic resonance images comprising the steps of:
    providing a diffusion-tensor magnetic resonance image (DT-MRI) volume, said image volume comprising a plurality of 3×3 diffusion tensors associated with a 3-dimensional grid of voxels;
    positioning and orienting a virtual camera for rendering said volume, said camera having an image plane;
    associating a billboard with each voxel, each said billboard being parallel with the image plane of the camera;
    applying a texture to each billboard, wherein said texture comprises an isotropic image;
    transforming each said texture into a pattern representative of said diffusion and transforming each said texture by the inverse of the diffusion tensor associated with the voxel to which the billboard is associated; and
    rendering said volume by rendering each visible billboard in said image volume, wherein a 2-dimensional (2D) visualization of said DT-MRI is produced.

9. The method of claim 8, further comprising determining the look, right and up vectors for the camera from the position and orientation of said virtual camera, wherein said look, right and up vectors are used to orient each said billboard.

10. The method of claim 8, wherein transforming each said texture into a pattern representative of said diffusion comprising scaling said texture, setting different boundary conditions on said textures, or creating a periodic pattern from said texture image.

11. A program storage device readable by a computer, tangibly embodying a program of instructions executable by the computer to perform the method steps for visualizing diffusion-tensor magnetic resonance images, said method comprising the steps of:
    providing a diffusion-tensor magnetic resonance image (DT-MRI) volume, said image volume comprising a plurality of 3×3 diffusion tensors associated with a 3-dimensional grid of voxels;
    positioning and orienting a virtual camera for rendering said volume, said camera having an image plane, said camera's orientation being defined by its look, right and up vectors;
    associating a billboard with each voxel, each said billboard being parallel with the image plane of the camera, wherein said look, right and up vectors are used to orient each said billboard;
    applying a texture to each billboard, each said texture being transformed by the inverse of the diffusion tensor associated with the voxel to which the billboard is associated; and
    rendering said volume by rendering each visible billboard in said image volume, wherein a 2-dimensional (2D) visualization of said DT-MRI is produced.

12. The computer readable program storage device of claim 11, wherein said texture comprises an isotropic image.

13. The computer readable program storage device of claim 11, the method further comprising transforming said texture into a pattern representative of said diffusion tensor.

14. The computer readable program storage device of claim 11, the method further comprising mapping a principle diffusion direction of the diffusion tensor associated with a voxel to a color, wherein said billboard associated with said voxel is rendered with said color.

15. The computer readable program storage device of claim 11, wherein a transparency of each billboard is determined by the fractional anisotropy of the diffusion tensor associated with each said billboard.

16. The computer readable program storage device of claim 11, the method further comprising rendering a sequence of 2D visualizations, wherein for each 2D visualization an additive offset is applied to each texture mapping along a principle diffusion direction of each said associated diffusion tensor, wherein an animation is produced.

17. The computer readable program storage device of claim 11, wherein said visualization is performed by programmable vertex shaders of a graphics processing unit.

* * * * *